United States Patent [19]

Childs et al.

[11] Patent Number: 5,442,772

[45] Date of Patent: Aug. 15, 1995

[54] COMMON BREAKPOINT IN VIRTUAL TIME LOGIC SIMULATION FOR PARALLEL PROCESSORS

[75] Inventors: Philip L. Childs, Raleigh, N.C.; Nimish S. Radia, Cortland; Joseph F. Skovira, Binghamton, both of N.Y.

[73] Assignee: International Business Machines Corporation, Armonk, N.Y.

[21] Appl. No.: 993,142

[22] Filed: Dec. 18, 1992

Related U.S. Application Data

[63] Continuation-in-part of Ser. No. 748,295, Aug. 21, 1991, Pat. No. 5,250,943, which is a continuation-in-part of Ser. No. 677,543, Mar. 29, 1991, abandoned.

[51] Int. Cl.$^6$ .............................................. G06F 15/16
[52] U.S. Cl. ................................... 395/500; 364/271.2; 364/271.3; 364/269; 364/DIG. 1; 364/578; 395/550
[58] Field of Search ................ 364/578; 395/500, 550, 395/200, 575

[56] References Cited

U.S. PATENT DOCUMENTS

| | | | |
|---|---|---|---|
| 4,306,286 | 12/1981 | Cocke et al. | 395/800 |
| 4,656,580 | 4/1987 | Hitchcock et al. | |
| 4,725,971 | 2/1988 | Doshi et al. | 364/578 |
| 4,751,639 | 6/1988 | Corcoran et al. | 395/575 |
| 4,819,234 | 4/1989 | Huber | 371/19 |
| 4,914,612 | 4/1990 | Beece et al. | 364/578 |
| 4,929,940 | 5/1990 | Franaszek et al. | 340/825.02 |
| 4,941,087 | 7/1990 | Kap | 395/725 |
| 4,985,860 | 1/1991 | Vlach | 364/578 |
| 5,006,978 | 4/1991 | Neches | 395/650 |
| 5,021,947 | 6/1991 | Campbell et al. | |
| 5,041,996 | 8/1991 | Nakai et al. | 395/550 |
| 5,072,364 | 12/1991 | Jardine et al. | 395/375 |
| 5,097,412 | 3/1992 | Orimo et al. | 395/500 |
| 5,111,413 | 5/1992 | Lazansky et al. | 364/578 |
| 5,115,502 | 5/1992 | Tallman | 395/500 |
| 5,129,077 | 7/1992 | Hillis | 395/500 |
| 5,222,229 | 6/1993 | Fukuda et al. | 395/550 |
| 5,239,641 | 8/1993 | Horst | 395/550 |
| 5,250,943 | 10/1993 | Childs et al. | 340/825.8 |
| 5,293,627 | 3/1994 | Kato et al. | 395/550 |
| 5,295,257 | 3/1994 | Berkovich et al. | 395/550 |
| 5,301,309 | 4/1994 | Sugano | 395/575 |
| 5,307,483 | 4/1994 | Knipfer et al. | 395/575 |

FOREIGN PATENT DOCUMENTS 63-059634 3/1988 Japan.
3297602 12/1991 Japan.

OTHER PUBLICATIONS

IBM TDB vol. 33, No. 3A, Aug. 1990, "Parallel Event-Driven Simulation" pp. 336–339.
ACM Transactions on Programming Languages & Systems, vol. 7, No. 3, Jul. 1985, D. R. Jefferson, U. of Southern California, pp. 404–425, "Virtual Time".
1990 International Conference on Parallel Processing, Y. Liu et al., Dept. of Computer Science & Eng., U. of Wash., Seattle, Wash., pp. 201–209, "Determining the Global Virtual Time in a Distributed Simulation".

*Primary Examiner*—Ken S. Kim
*Attorney, Agent, or Firm*—Arthur J. Samodovitz

[57] ABSTRACT

A logic simulator is distributed over a plurality of processing nodes for simulating a circuit. A plurality of logic simulation programs execute on respective ones of the nodes, and simulate respective parts of the circuit. Each of the logic simulation programs executes at its own pace, and either receives an input from or supplies an output to another of the nodes. Each of the logic simulation programs also predicts an input when unavailable from another of the nodes. A host broadcasts a breakpoint time to all of the nodes. A plurality of logic simulation controllers execute on respective ones of the nodes, and direct storage of nets and/or states of the logic simulation programs. Each of the logic simulation controllers receives the breakpoint time from the host and reports to the host when the respective logic simulation program has advanced to or past the breakpoint time. When all of the nodes have reported that their respective logic simulation programs have advanced to or past the breakpoint time, this means that nets and states at the breakpoint time are valid. Then, the host obtains from one or more of the nodes values of one or more nets and/or states at the breakpoint time. In another mode of operation, before broadcasting the breakpoint time, the host sends to one of the nodes responsible for generating a condition or event a request to notify the host when the condition or event occurs and a local virtual time that the condition or event occurred. The host then broadcasts the local virtual time as the breakpoint time.

20 Claims, 13 Drawing Sheets

COMMON BREAKPOINT IN VIRTUAL TIME LOGIC SIMULATION FOR PARALLEL PROCESSORS

This application is a continuation in part of application Ser. No. 07/748,295, filed Aug. 21, 1991 by Childs et al. (now U.S. Pat. No. 5,250,943). Ser. No. 07/748,295 is a continuation-in-part of Ser. No. 07/677,543 filed Mar. 29, 1991 now abandoned.

BACKGROUND OF THE INVENTION

The invention relates generally to electronic logic simulation, and deals more particularly with monitoring results of logic simulation performed on parallel processors for different parts of one circuit.

Previously known logic simulators assist in the design, development and debugging of complex circuitry. For example, the logic simulator may determine if a proposed circuit design performs the requisite function and meets other specifications, before the circuitry is built. The simulator can simulate digital logic and even analog circuitry. Each logic simulator comprises one or more computer programs and data structures to simulate the circuitry. For each logic component, such as an AND gate, the logic simulator program includes a subroutine which performs a logical AND operation and maintains a data structure which stores the inputs and resultant outputs. The computer program can also supply some or all of the digital input signals to the simulated circuit, to initiate operation of the simulated circuit. The digital input signals simulate electronic signals that would be supplied by other circuitry or programming associated with the simulated circuit.

There are different types of logic simulators. Cycle simulators evaluate all gates at each simulation time, and record the respective outputs and states. Because all gates are evaluated at each simulation time, cycle simulators are easy to design, but slow to execute and require much memory.

Event simulators evaluate only those gates whose input(s) have changed at evaluation time. This technique requires sophisticated routines to determine which gates have changed inputs at evaluation time, but requires fewer evaluations at each simulation time compared to cycle simulators. In order to improve the speed of event simulators, different parts of one complex circuit can be simulated on multiple processors or nodes. One part of the circuit simulated on one node can interact with, i.e. provide input signals for and receive output signals from, another part of the same circuit simulated on another node by sending output messages and receiving input messages, respectively.

There are known techniques for coordinating execution of different portions of one simulated logic circuit whose portions are distributed on multiple nodes.

In a "synchronous" technique, all portions of the logic simulation are controlled by a common clock and performed synchronously with all other portions. While this technique provides accurate simulation, no portion of the logic simulation can advance its operation faster than the common clock and many portions have no activity during many of the clock cycles. In a "conservative" technique, each node uses its own simulation clock and proceeds at its own pace (advancing its own clock) until the node requires an input from another (neighbor) node. Then, the node waits for the input. In this technique, each node may spend much time waiting for inputs from other nodes. In a "virtual time" technique, each node uses its own simulation clock and proceeds at its own pace. However, unlike the conservative technique, if one node requires an input from another node and this other node has not yet reached the point of providing the input, then the one node predicts the input and continues on. Later, this other node will provide the input, and if the prediction was wrong, then the one node and any other nodes which received inputs from the one node must be rolled-back and re-executed to reflect the correct input. In most virtual time logic simulators, the predictions are a repetition of the previous input and this is usually correct because in a typical circuit, most inputs do not change often. Thus, the virtual time technique may substantially increase the overall speed of operation of the logic simulation.

In the previously known virtual time technique, the host frequently asks each node the respective simulation time of the node. After receiving the responses from all the nodes, the host determines the minimum of the simulation times. This minimum represents a global virtual time (GVT) for the entire system. All gate outputs and states at or before the GVT are valid because none of the nodes will provide an input for another node at an earlier time and therefore, none of the nodes will be rolled-back before the GVT. It was also known in the virtual time technique for each of the nodes to report to the host a minimum virtual time instead of the actual simulation time. The minimum virtual time is the minimum of the actual simulation time and the virtual time of any messages that the node has sent to another node and not yet received an acknowledgement. This ensures that the resultant GVT cannot be undermined by any messages in transit. After all nodes complete their portion of the logic simulation, a host user may request various nets and states of the simulated logic.

A general object of the present invention is to improve a virtual time simulator to monitor outputs and states of logic components being simulated at predetermined points of operation.

SUMMARY OF THE INVENTION

A logic simulator is distributed over a plurality of processing nodes for simulating a circuit. A plurality of logic simulation programs execute on respective ones of the nodes, and simulate respective parts of the circuit. Each of the logic simulation programs executes at its own pace, and either receives an input from or supplies an output to another of the nodes. Each of the logic simulation programs also predicts an input when unavailable from another of the nodes. According to the present invention, a host broadcasts a breakpoint time to all of the nodes. A plurality of logic simulation controllers execute on respective ones of the nodes, and direct storage of nets and/or states of the simulated circuit. Each of the logic simulation controllers receives the breakpoint time from the host and reports to the host when the respective logic simulation program has advanced to or past the breakpoint time. When all of the nodes have reported that their respective logic simulation programs have advanced to or past the breakpoint time, this means that nets and states at the breakpoint time are valid. Then, the host obtains from one or more of the nodes values of one or more nets and/or states at the breakpoint time.

According to another mode of operation, before broadcasting the breakpoint time, the host sends to one of the nodes responsible for generating a condition or event a request to notify the host when the condition or event occurs and a local virtual time that the condition or event occurred. The host then broadcasts the local virtual time as the breakpoint time.

DETAILED DESCRIPTION OF THE PREFERRED EMBODIMENTS

Figure 1:
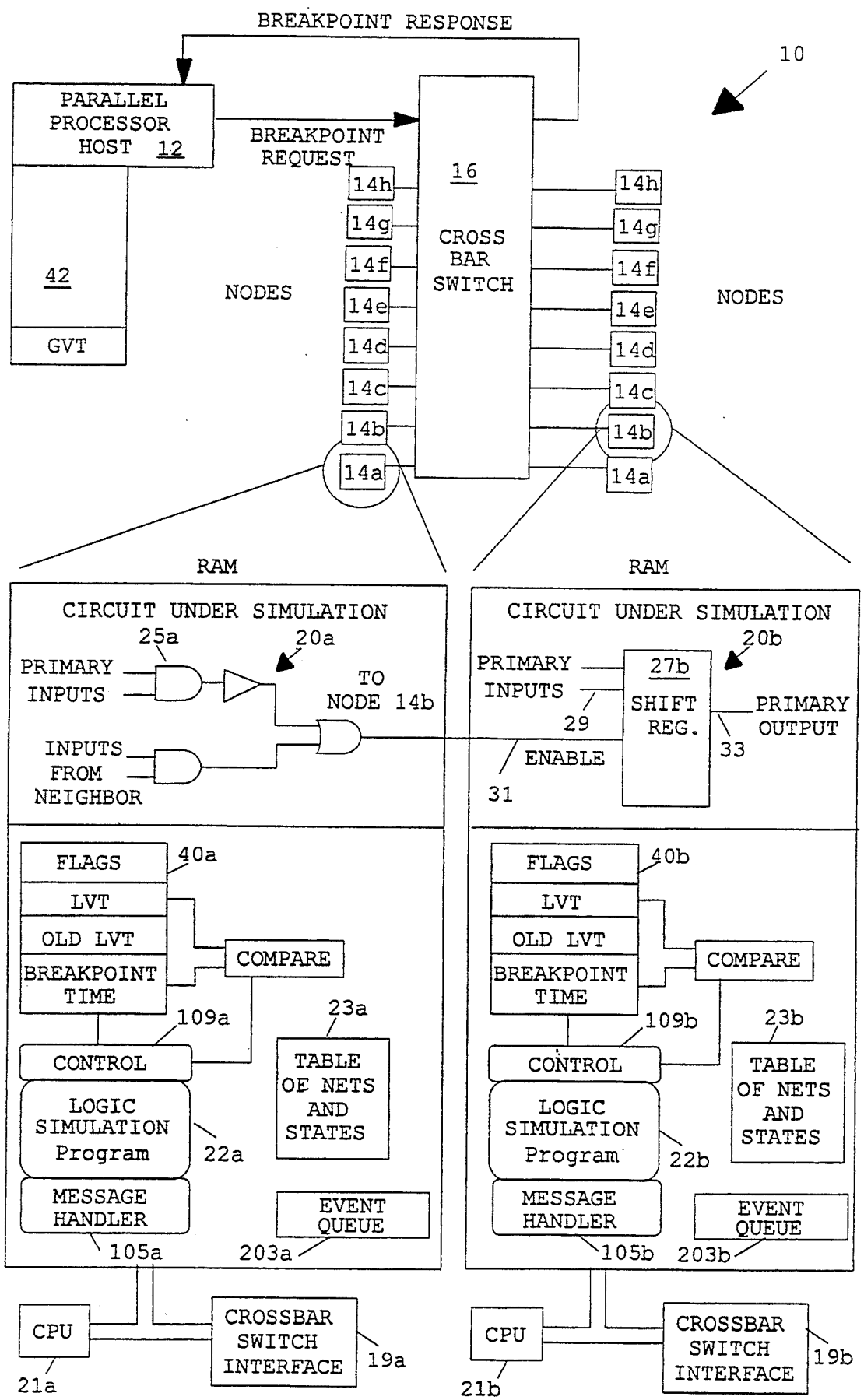
FIG. 1 is a block diagram of a computer network comprising a host computer and parallel processors. The network simulates a circuit and monitors nets and states of the simulated circuit according to the present invention.

Referring now to the figures in detail wherein like reference numerals indicate like elements throughout the several views, FIG. 1 illustrates a distributed logic simulator generally designated 10 according to the present invention. Logic simulator 10 comprises a host computer 12 with a known communication facility (not shown), a multiplicity of processing nodes 14a–h each with a respective known communication facility (not shown), and a known cross bar switch 16 which interconnects the host computer to the parallel processors and the parallel processors to each other. By way of example, the host computer and each of the parallel processors is provided by a RISC/6000 (R) work station, and the cross bar switch and interface 19 are described in U.S. Pat. No. 4,929,940 which is hereby incorporated by reference as part of the present disclosure.

Each of the nodes simulates a respective portion 20a–h of a logic circuit (although for simplicity only two of the parallel processing nodes 14a,b and two of the corresponding logic circuits 20a,b are shown in detail in FIG. 1, and only simple logic is shown). The simulation of logic portion 20a is provided by a logic simulation program 22a which executes on a CPU 21a and maintains a corresponding table of nets and states 23a. The table 23a records the nets and states (inputs-/outputs and states) of each simulated component at each time that the simulated logic advances in its simulation, i.e. each time that the simulated logic receives a new input. When the program 22a receives inputs for the simulated logic 20a, the program 22a processes the inputs to yield the same result that actual logic would yield, using the table of nets and states 23a to store the inputs/outputs and state of each logic component of the simulated logic 20a. For example, the nets for AND gate 25a would indicate the logic levels for the two inputs and the logic level for the single output at each advancement time. The nets for shift register 27b would indicate the logic level for each of the inputs and output, and the state of shift register indicates the latched level when the shift register was last clocked. In FIG. 1, "primary inputs" are inputs to the circuit being simulated and are generated externally of the circuit. "Inputs from neighbor" refers to inputs provided by outputs from another node. "Primary outputs" are outputs generated by the simulated circuit and can be observed externally of the simulated circuit, and "outputs to neighbors" refers to outputs supplied to another node as an "input from neighbor". The actual logic simulation performed by each of the logic simulation programs 22 alone can be that described in "Virtual Time" published in ACM Transactions on Programming Languages by Jefferson Vol. 7, No. 3, July 1985, pages 404–425, and is not part of the present invention. (The present invention relates to monitoring nets and states of simulated logic on different nodes at predetermined point of operation.) As described in more detail below, each of the logic simulation programs 22 proceeds at its own pace, predicting inputs when needed and not yet available from another node. Different types of prediction techniques are known from the prior art as described above. The most common technique for such inputs assumes that the input does not change with time.

Each of the nodes exhibits a "local virtual time" (LVT) which indicates the point in time at which the respective logic simulation has advanced. Each of the logic simulation programs 22 establishes the LVT for the respective node by the progress of its simulation and maintains a record of the current LVT in a control block 40. It should be noted that if a predicted input for a node was incorrect as evidenced by an actual input subsequently provided by another (neighbor) node, then the logic simulation and LVT for the node must be rolled-back to the point when the input was required and re-executed from this point onward with the actual input. The LVT is usually different at each node. Also, as described below, the host records in a control block 42 a "global virtual time" (GVT) which is a minimum time at or beyond which all nodes have advanced. As a general rule, once all nodes have advanced to or beyond a certain time, then none of the nodes will need to roll back before this time because all will have the actual inputs available at this time.. Thus, the GVT is a time at which the nets and states for all nodes are valid.

Time Breakpointing

Figure 2A:
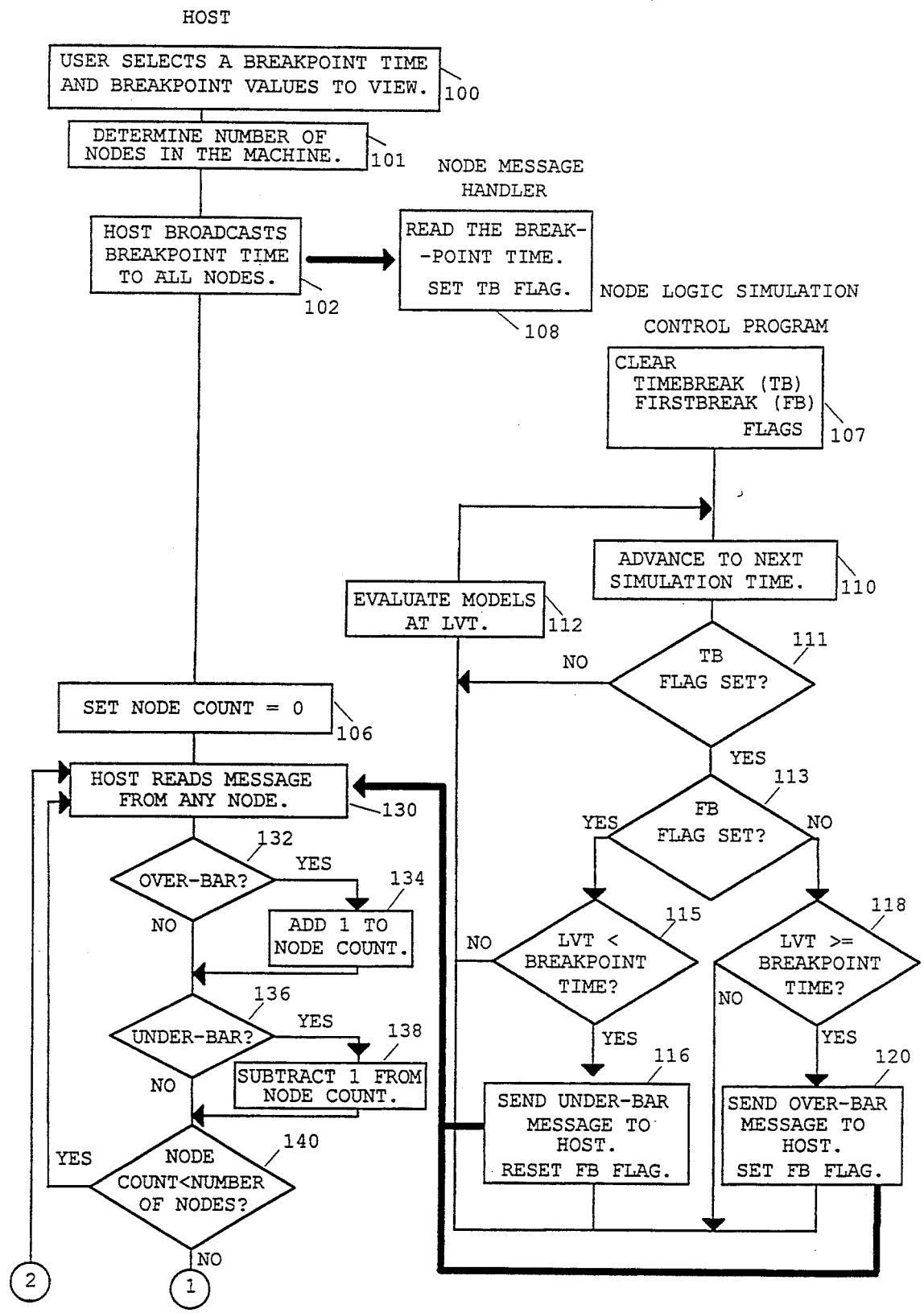
FIGS. 2A, 2B, and 2C together form flow charts which illustrate time breakpoint operation of the host computer and nodes of FIG. 1 according to the present invention.
Figure 2B:
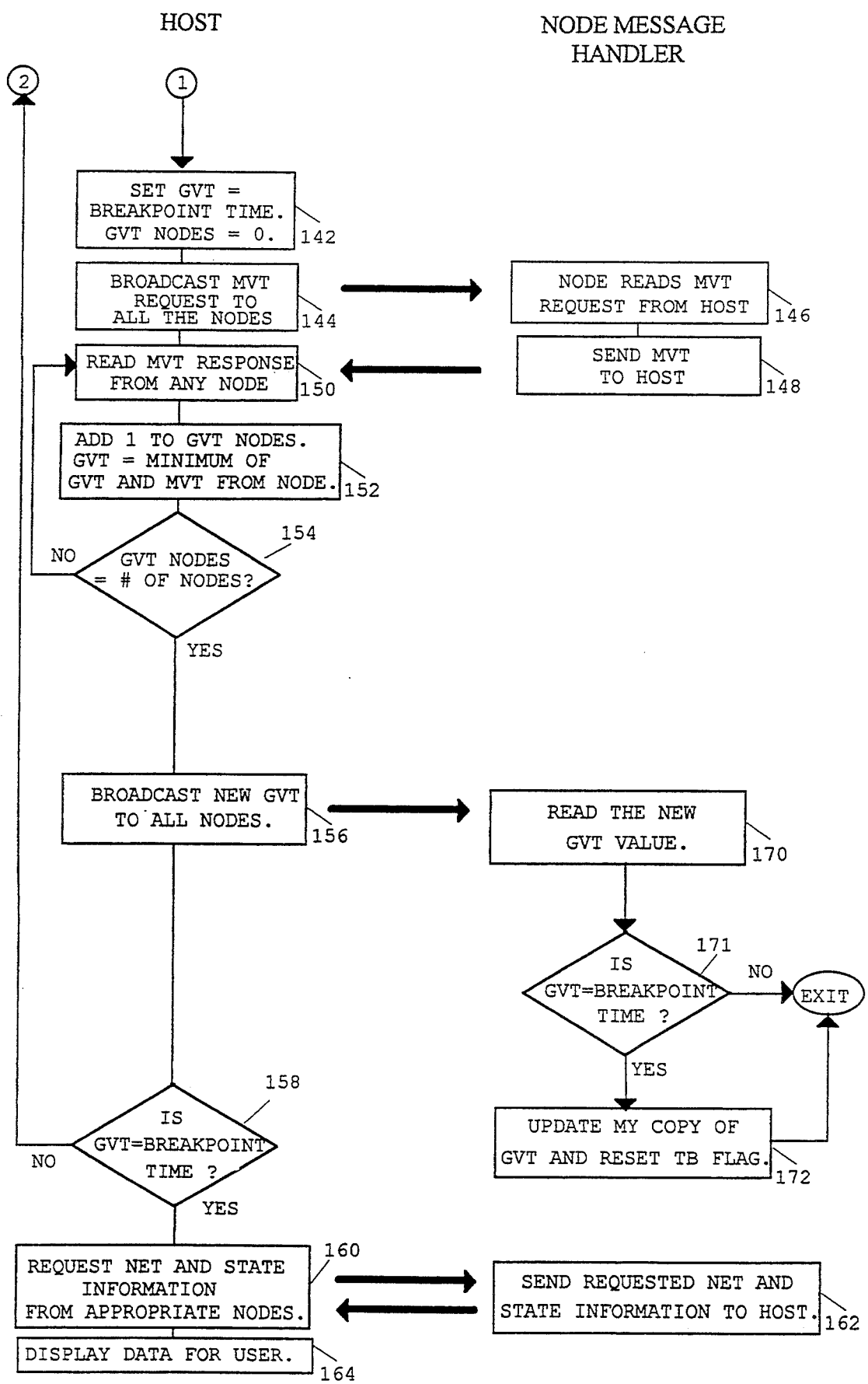

FIGS. 2(a,b,c) illustrate a process according to the present invention for monitoring the logic simulations provided by the multiple nodes 14a–h at predetermined breakpoint times. In step 100 of FIG. 2(a), a host user selects a "breakpoint time", and specifies nets and states of certain logic components that the host user would like to read at the time breakpoint. Next, the host determines the identifications and number of nodes involved in the logic simulation by reading a system variable (step 101) and broadcasts the time breakpoint to all of these nodes via the respective communication facilities and crossbar switch interfaces 19 (step 102). Next, the host computer sets a "node count" equal to zero (step 106). The node count indicates the number of logic simulation nodes that have reached the specified breakpoint and communicated this fact to the host computer after the host computer broadcasts the time breakpoint.

Upon activation, a logic simulation control program 109 within each of the nodes clears a time break flag and a first break flag (step 107) and begins the logic simulation program 22 (step 110). As noted above, in each node the logic simulation proceeds at its own pace and advances at different discrete times, and the respective LVT advances accordingly. The time break flag, when set, indicates that a request has been made for a breakpoint. The first break flag is set the first time that the node advances to or past the breakpoint.

In response to the broadcast of the breakpoint in step 102 and in parallel with step 106, a message handler 105 within each of the nodes receiving the broadcast, reads and stores the breakpoint time in control block 40, and sets the TB flag (step 108). (The message handler 105 can preempt the logic simulation control program 109 and logic simulation program 22 in a single tasking environment or comprise a different thread in a multitasking environment.)

After each advance in the LVT pursuant to step 110, the logic simulation control program determines if the time break flag is set (decision 111). If not, then the simulation program determines and stores the nets and states at the current LVT, may send net messages to neighboring node(s) (step 112) and loops back to step 110 to advance the logic simulation. If the timebreak flag is set, then decision 111 leads to decision 113 in which the logic simulation control program determines if the firstbreak flag is set. If not, then the logic simulation control program determines if the LVT is now equal to or greater than the breakpoint (decision 118). If not, then the logic simulation control program loops back to step 112 and then step 110 as described above to store the current nets and states and advance the logic simulation. The LVT within the node will eventually reach the breakpoint, at which time decision 118 leads to step 120 in which the logic simulation control program sends an over-bar message to the host and sets the first break flag. Then the logic simulation control program loops back to step 112 and then step 110 as described above to store the current nets and states and advance the logic simulation.

During the next iteration of the logic simulation control program of FIG. 2(a), the first break flag is set and decision 113 leads to decision 115 in which the logic simulation control program determines if the LVT is still equal to or greater than the breakpoint (decision 115). This should be the case unless the logic simulation was recently rolled-back (since the time of step 120). Assuming the LVT is still equal to or greater than the break point, then the logic simulation control program loops back to step 112 and step 110. The logic simulation control program does not now send an over-bar message to the host because one was sent previously in step 120 when the first break flag was set.

Figure 2C:
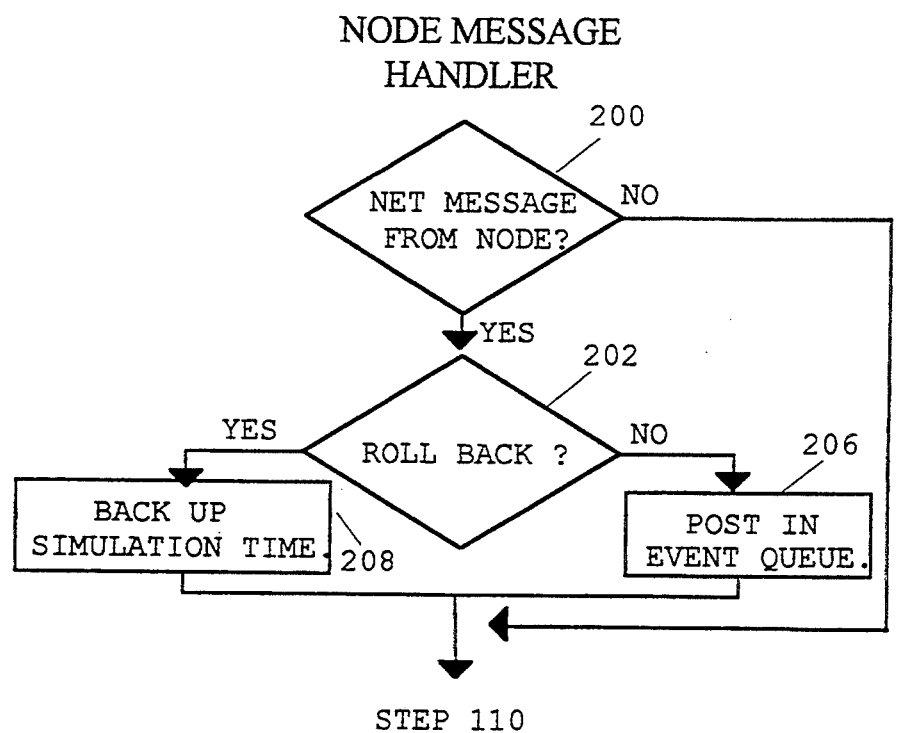

Logic simulation advances and is processed according to steps 110, 111, 113, 115 and 112 unless and until the logic simulation is rolled back to a time before the break point. As illustrated in FIG. 2(c), if a message received by the node is a net input from another node (with statement of time of net) (decision 200), the logic simulation control program determines if a roll back is required (decision 202). A roll back is required if the input corresponds to a time before the LVT of the receiving node, and the prediction made in the receive node for this input was incorrect. If no roll back is required, then the logic simulation control program stores the net in an event queue 203 for execution at a later time (step 206). If roll back is required, then the logic simulation control program rolls back the logic simulation to the time of the net (neighbor) input by restoring past values in the table 23 and beginning the logic simulation again at the roll back time using the newly received net (neighbor) input and all other required nets and states (step 208).

After either step 206 or 208, the logic simulation control program continues with step 110, decision 111 and decision 113 as described above. However, if the LVT is now less than the breakpoint, then decision 115 leads to step 116 in which the logic simulation control program sends an under-bar message to the host and resets the first break flag (step 116). Then, the logic simulation control program continues with steps 112 and 110 as described above.

The host receives each under-bar and over-bar message from any node in step 130. If the message is over-bar, then the host increments the node count (decision 132 and step 134); however, if the message is under-bar, then the host decrements the node count (decision 136 and step 138). If the node count is now less than the recorded number of nodes that participate in the logic simulation (decision 140), then the host continues with step 130 to await additional messages from the nodes. However, if the node count now equals the recorded number of nodes, then the host sets the GVT equal to the breakpoint time (step 142), and broadcasts a request that each of the nodes reports its "minimum" virtual time (MVT) (step 144). The MVT is the minimum of the LVT of the node and the time of any message that this node has sent to another node which the other node has not yet acknowledged. After receiving the MVT request from the host (step 146), each of the nodes 14a–h sends the respective MVT to the host (step 148). The host receives the respective MVT from each of the nodes (step 150) and sets the GVT equal to the minimum of the MVT of all nodes and the breakpoint (step 152). The MVT from each node will usually equal or exceed the breakpoint/GVT except when a node has rolled back after sending an over-bar message to the host. Referring again to decision 158, if the GVT does not now equal the breakpoint, then the host loops back to step 130 to await new over-bar and under-bar messages from the other nodes. Steps 150 and 152 are repeated for each node (decision 154). When all the nodes have responded with their respective MVT, the new GVT is broadcast to all nodes (step 156). Each node receives the broadcast (step 170), and if the GVT equals the breakpoint time (decision 171) updates the respective control block 40 and resets the time break flag (step 172). If the GVT now equals the breakpoint time (which is usually the case) (decision 158), then the host requests from the respective nodes the nets and states previously requested by the user in step 100 (step 160). In step 162, each the other nodes fetches and returns the requested information to the host. Then, the host displays the requested nets and states to the user (step 164).

Figure 3:
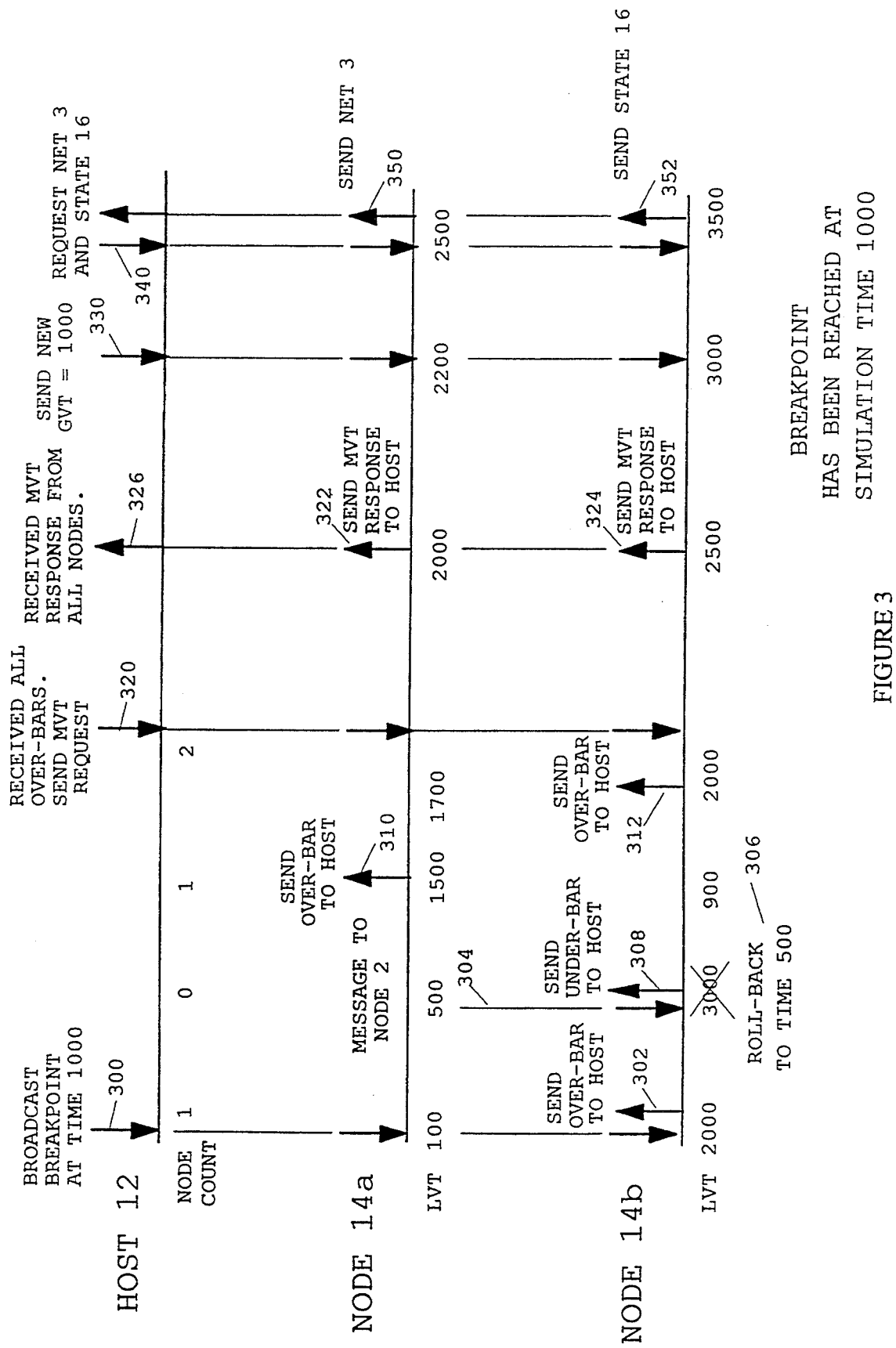
FIG. 3 is a timing chart illustrating one example of time breakpoint operation of the host computer and nodes of FIG. 1 according to the present invention.

FIG. 3 illustrates events of a specific example of the present invention as described above in which the host user specifies a breakpoint time. For simplicity, just two nodes 14a,b simulate the entire circuit (although ordinarily there are many more). The host broadcasts a breakpoint time of 1000 to nodes 14a,b (step 300). When the broadcast occurs, node 14a is at 100 LVT and node 14b is at 2000 LVT. (Thus, each of the nodes has already performed part of the respective logic simulation.) Because node 14b is already past the breakpoint, node 14b immediately responds with an over-bar message (step 302). In response, the host increments the node count to one. Each node proceeds at its own pace with its respective logic simulation and advancement of its respective LVT. Node 14a advances its logic simulation to LVT 500 and sends a net (neighbor) input to node 14b (step 304). In the illustrated example, node 14b previously predicted this input incorrectly, and must now roll back from 3000 LVT to 500 LVT (step 306) and repeat logic simulation from 500 LVT using the correct input. Also, node 14b now sends an under-bar message to the host because the LVT for node 14b is now less than the breakpoint (step 308). In response, the host decrements the node count to zero. Logic simulation continues at each node. Node 14a advances its logic simulation to 1500 LVT, and sends an over-bar message to the host at 1500 LVT (step 310). In response, the host increments the node count to one. Logic simulation continues at each node. Node 14a advances its logic simulation to 1700 LVT but does not send another over bar message to the host because one was sent at LVT 1500. Node 14b advances its logic simulation to 2000 LVT and sends an over-bar message to the host (step 312). In response, the host increments the node count to two.

At this time, both nodes 14a,b have reached or exceeded the breakpoint (as evidenced by the node count), and the host broadcasts an MVT request to each node requesting the MVT for the node (step 320). In response, node 14a sends its MVT to the host (step 322) and likewise, node 14b sends its MVT to the host (step 324). In the illustrated example, node 14a has now advanced to LVT 2000 and node 14b has now advanced to LVT 2500. The host receives both MVTs (step 326), determines the minimum of both and the breakpoint, and sends the minimum (which is time 1000 in this case) to both nodes 14a,b (step 330). Both nodes update their respective control block 40 with the new GVT and continue with their logic simulation.

Next, the host sends a request to each node for the specific nets and states requested by the host user (step 340). In the illustrated example, the host user previously requested from node 14a the third net at time 1000 and from node 14b the sixteenth state at time 1000. In steps 350 and 352, the nodes respond with the requested information.

Condition Breakpointing

FIGS. 4(a,b,c,d,e,f) illustrate operation of the host 12 and logic simulation nodes 14 when a host user specifies a breakpoint in terms of the occurrence of an event or condition. For example, the host user requests various nets and states when a specific logic component exhibits a certain state or yields a certain output such as when a counter in the simulated logic outputs a certain count. The general strategy of the present invention is as follows. The host notifies the node that is responsible for generating the specified event or condition of the specified event, and requests that this node report to the host when the specified event or condition occurs and the LVT of the specified event. All the nodes proceed with their respective portion of the logic simulation at their own pace, and the specified node reports the requested information to the host when the specified event occurs. Then, the host defines a breakpoint as the LVT of the specified event, and processing at the host and nodes proceeds generally as described above with reference to FIGS. 2(a,b,c), i.e. the host broadcasts the breakpoint time to all of the nodes that participate in the logic simulation. When all of the nodes report an over-bar message to the host, then the host requests from the nodes the nets and states that were also specified by the user.

Figure 4A:
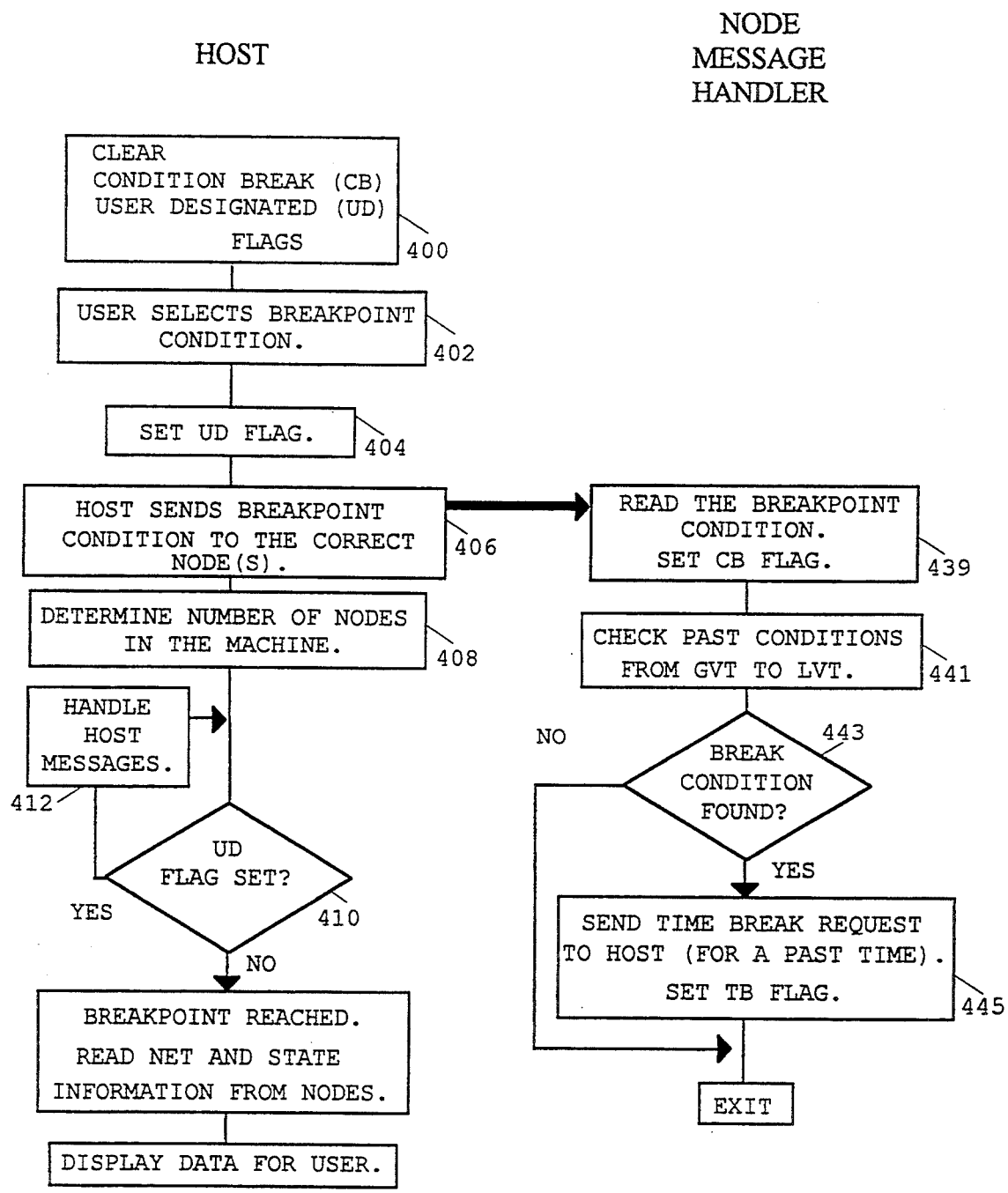
FIGS. 4A, 4B, 4C, 4D, 4E, and 4F together form flow charts which illustrate condition breakpoint operation of the host computer and nodes of Figure 1 according to the present invention.

The following is a more detailed description of the foregoing process with reference first to FIG. 4(a). Upon initiation, the host clears a user designate (UD) flag and a condition breakpoint (CB) flag (step 400). The UD flag, when set, indicates that the user has specified a condition breakpoint and all nodes have not yet reached and reported the over-bar. The CB flag is set when the time breakpoint corresponding to the specified condition has been determined but not yet reached. After the flags are cleared, the user selects a condition breakpoint (step 402), and in response, the host sets the UD flag (step 404). Then, the host determines from partitioning information which node performs that portion of the logic simulation that is responsible for exhibiting the specified condition and sends the breakpoint condition to the specified node (step 406). Next, the host determines from a system variable set at initialization how many nodes participate in the logic simulation (step 408). Because the UD flag is set (decision 410), the host loops back to step 412 to await messages from the nodes. The first message that the host expects is a notification that the specified node has reached the breakpoint condition and a report of the LVT at which the breakpoint condition occurred.

Figure 4B:
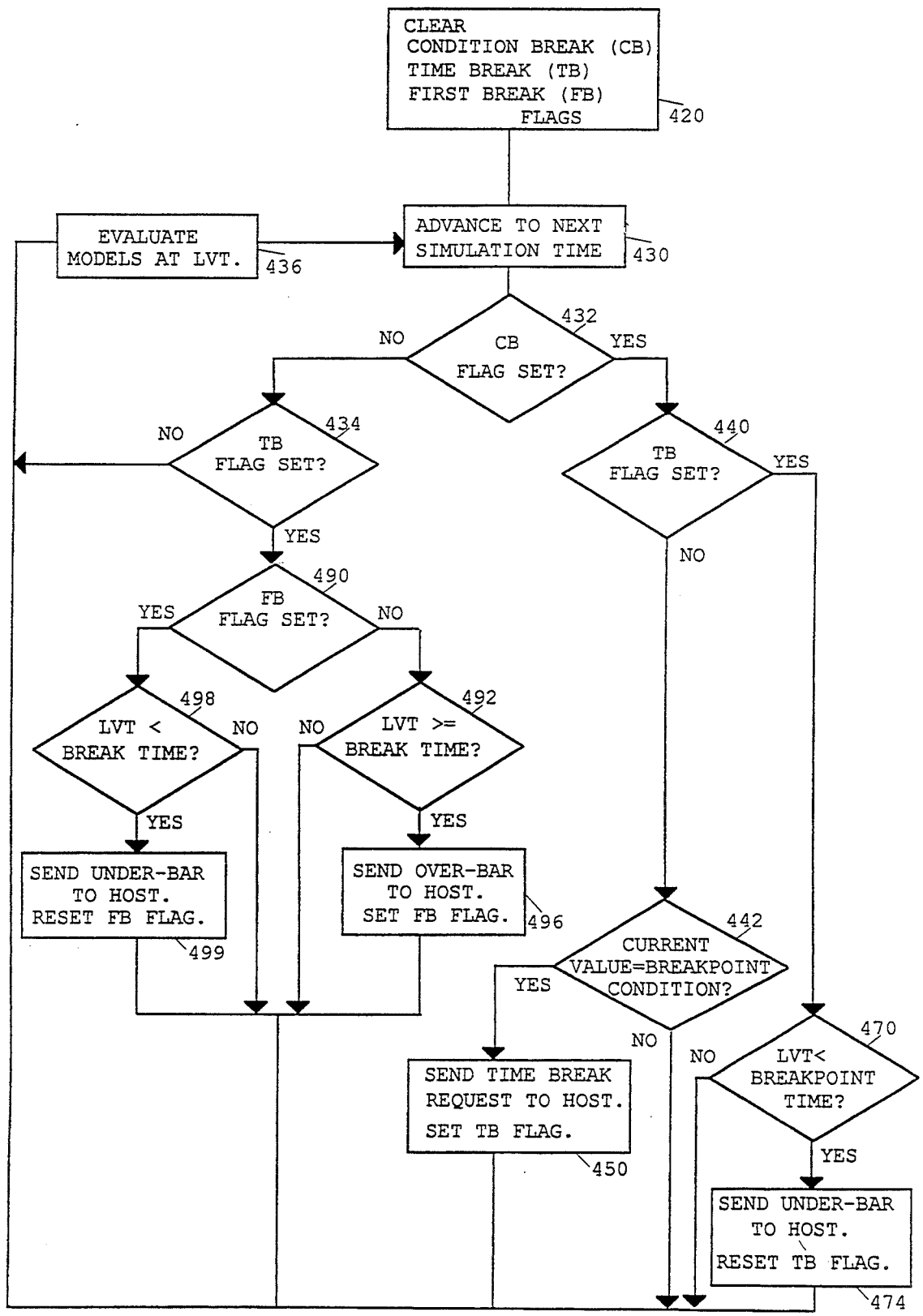

In each node the logic simulation proceeds at its own pace and advances at different discrete times, and the respective LVT advances accordingly. This is illustrated in FIG. 4(b) which begins when the logic simulation control program resets a condition breakpoint flag, a time break flag and a first break flag (step 420). In step 430, the logic simulation control program advances the logic simulation and LVT to the next point of change. Then, the logic simulation control program determines if the CB flag is set (decision 432).. Assuming this is not the case yet, decision 432 leads to decision 434 in which the logic simulation control program determines if the TB flag is set. Assuming this is also not the case yet, processing continues with step 436 in which the logic simulation control program determines from the logic simulation program the nets and states at the current LVT and stores the information in table 23. Then, the logic simulation control program loops back to step 430 to advance the logic simulation. The foregoing steps 430,432,434 and 436 are repeated until the node receives a message defining a condition breakpoint (if the node is the specified node) or a time breakpoint (if the node is another node that participates in the logic simulation) or the logic simulation completes.

In response to the breakpoint condition message sent by the host in step 406, the specified node stores the respective breakpoint condition and sets the CB flag (step 439 of FIG. 4a). Then, the node determines from the table of nets and states whether the breakpoint condition has already occurred (step 441), and if so (decision 443) sends the notification and earliest LVT at which the condition occurred to the host (step 445). The next time that the logic simulation control program of this specified node executes decision 432 of FIG. 4b, processing continues with decision 440 because the CB flag is now set. In decision 440, the logic simulation control program determines if the TB flag is set. This should not be the case yet in the foregoing example because this node might not yet have reported the condition breakpoint to the host. Therefore, processing continues with decision 442 in which the logic simulation control program determines if a stored or current state of the respective portion of the simulated logic is the breakpoint condition. Assuming this is not the case, processing continues with steps 436 and 430 as described above. Steps 430, 432, 440, 442 and 436 are repeated until the specified condition occurs. During the next iteration of decision 442, processing continues with step 450 in which the logic simulation control program sends to the host a notification that the specified condition has occurred and the LVT at which the condition occurred. This notification also serves as an over-bar message for this node. Also in step 450, the logic simulation control program sets the TB flag.

Figure 4C:
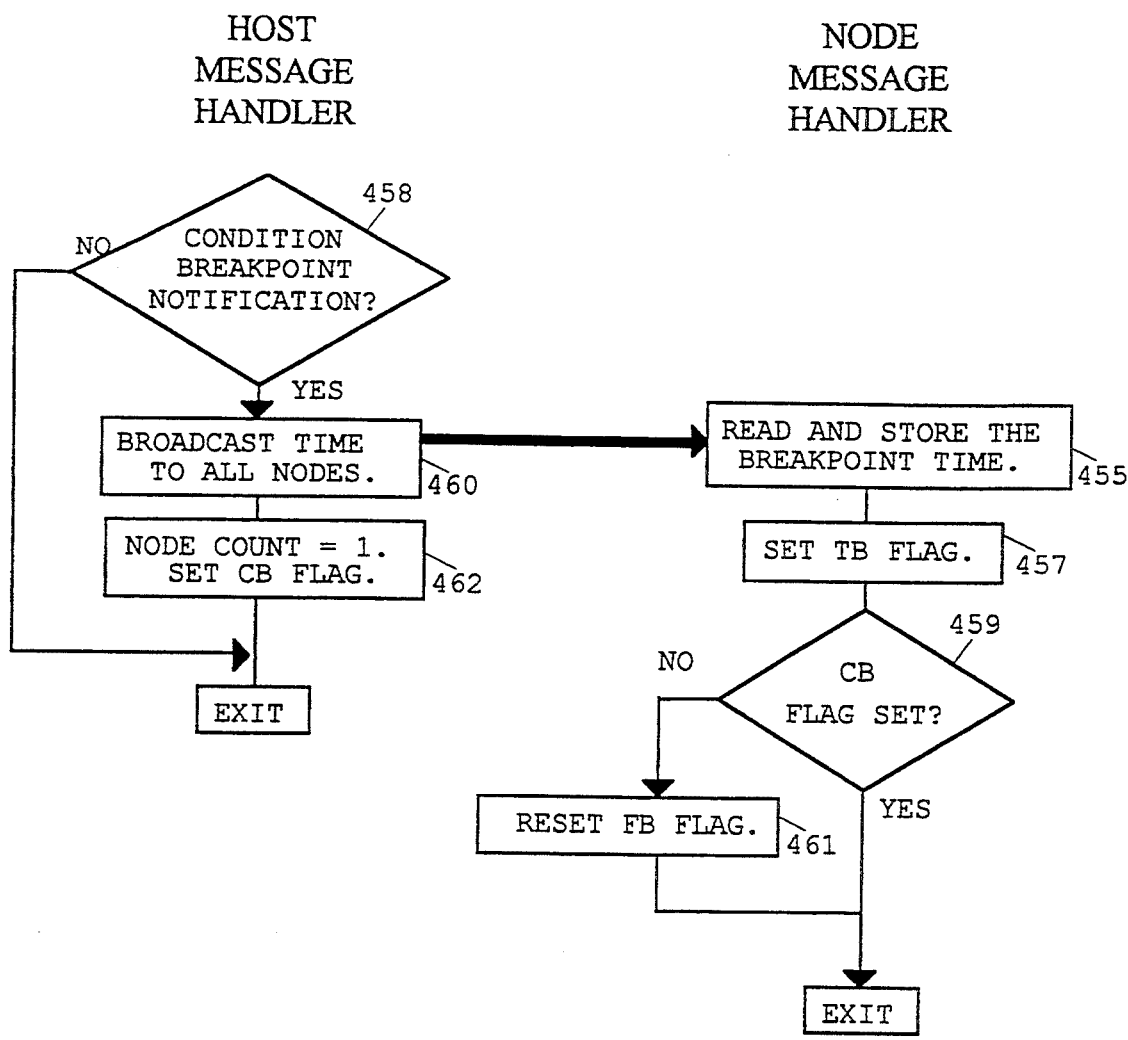

In response to the notification, the host broadcasts the time of the specified condition to all the nodes (decision 458 and step 460 of FIG. 4(c)), sets the node count equal to one and sets the CB flag (step 462). Then, the host waits for the over-bar and under-bar messages from the nodes. In response to the broadcast, each of the nodes reads and stores the breakpoint time and sets the TB flag (steps 455 and 457). (In the specified node, the TB was already set so this duplicative setting has no effect). Then, if the CB flag is not set (decision 459), the node resets the FB flag (step 461).

Referring again to FIG. 4(b), each of the nodes continues with its logical simulation at its own pace, and step 430 and decision 432 are executed as above. However, now the TB flag is set, so for the node that participated in the condition breakpoint, both the CB flag and TB flag are set so decision 440 leads to decision 470 in which the node determines whether the LVT is less than the breakpoint. This will not be the case unless there was a recent roll back because the node recently exhibited the specified condition and by definition, this was the breakpoint. Therefore, usually decision 470 leads back to step 436 in which the current nets and states are stored in table 23 and then to step 430 in which the logical simulation is advanced. However, if the logical simulation is ever rolled back to a time before the breakpoint, then decision 470 would lead to step 474 in which the logic simulation control program sends an under-bar message to the host and resets the TB flag.

For the other nodes that did not participate in the specified condition, the CB flag is zero (not set) and the TB flag is set so decision 432 leads to decision 434 which leads to decision 490. In decision 490, the logic simulation control program determines if the FB flag is set. This should not be the case yet because this is the first advancement after receiving the time breakpoint. Next, the logic simulation control program determines if the LVT is equal to or greater than the breakpoint time (decision 492). If not, then the logical simulation program loops back to step 436. However, if true, then the logic simulation control program sends an over-bar message to the host and sets the FB flag (step 496). In the latter case, for subsequent iterations of the logical simulation control program, the FB flag is set so decision 490 leads to decision 498 in which the logic simulation control program determines if the LVT is less than the breakpoint time. This will not be the case unless there has been a roll back as described above with reference to steps 202, 206 and 208, and absent such a rollback, processing continues with step 436. However, if there has been such a roll back to a time before the breakpoint, then the logic simulation control program sends an under-bar message to the host and resets the FB flag (step 499).

Figure 4D:
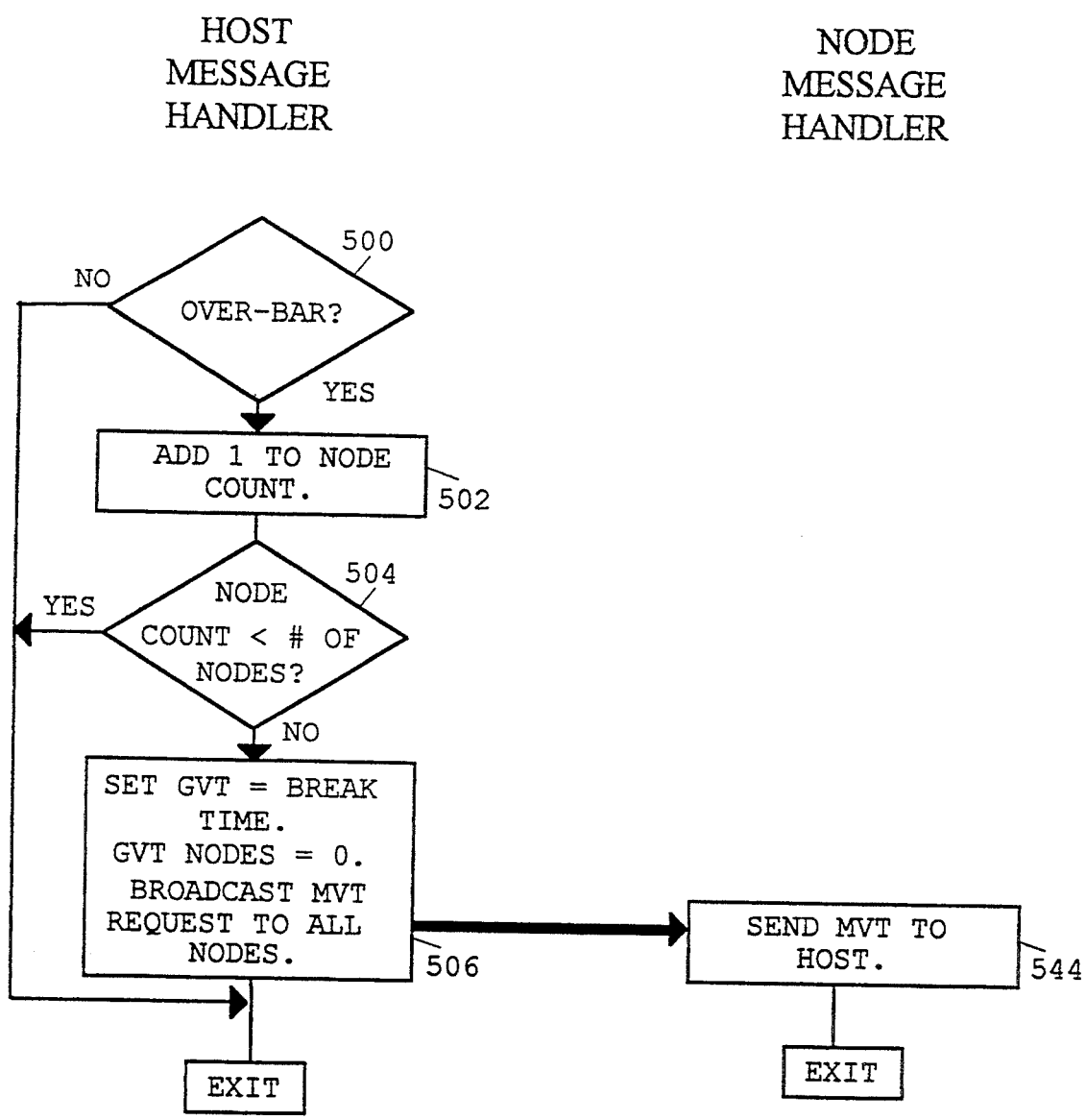
Figure 4E:
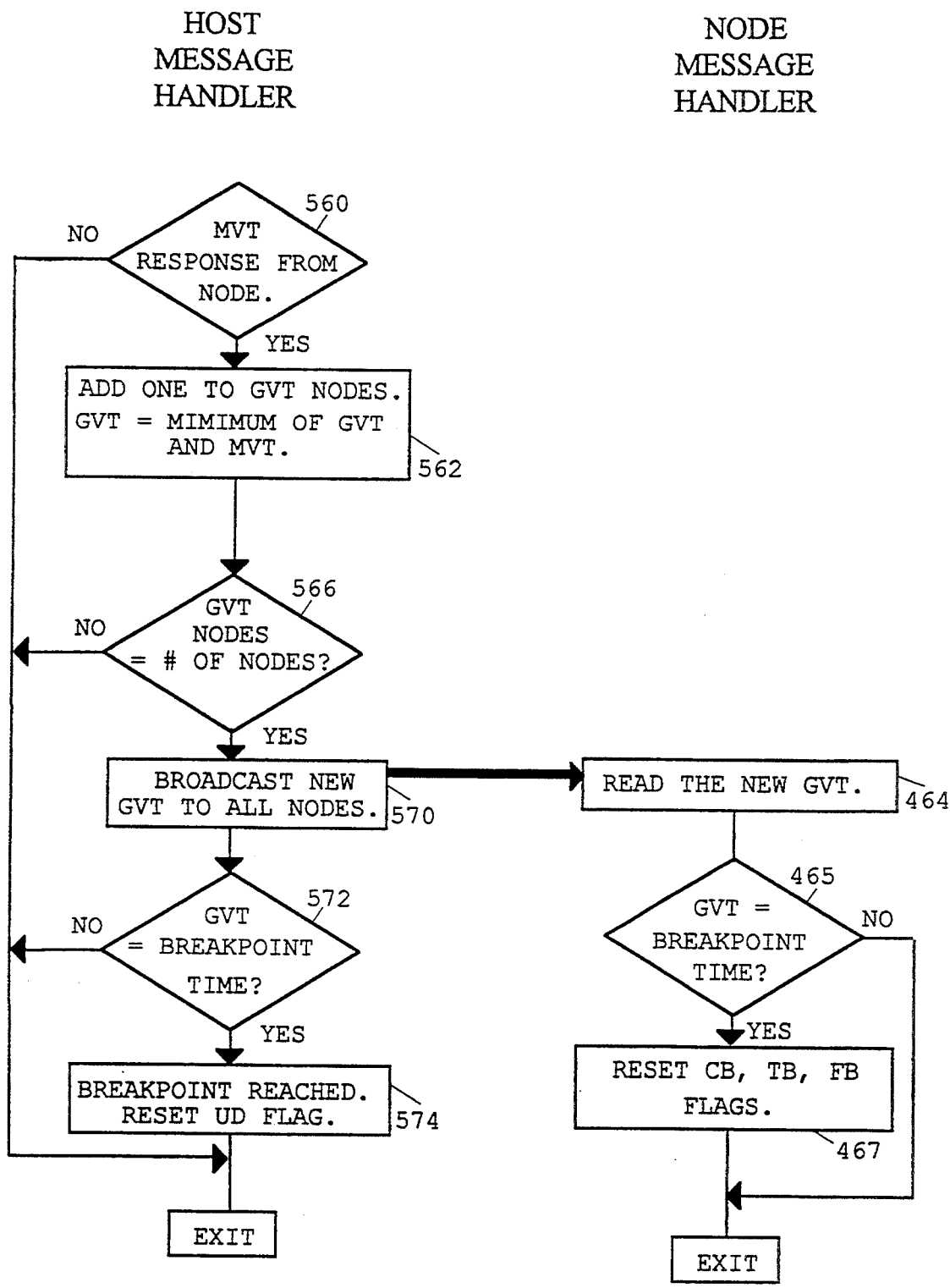
Figure 4F:
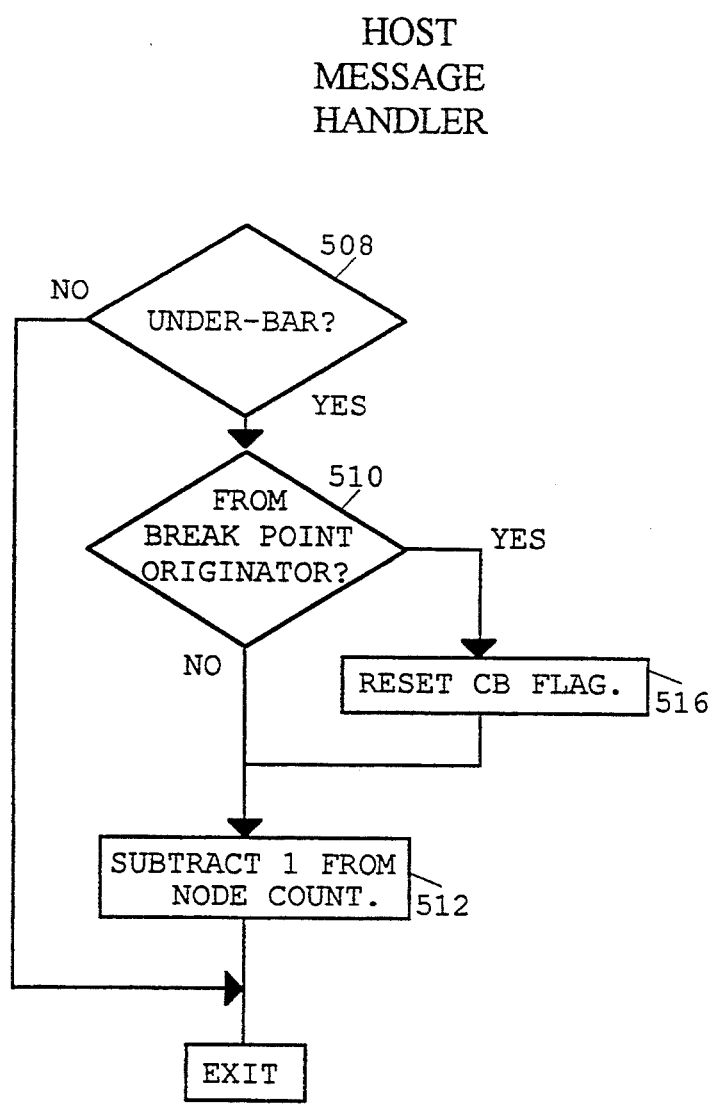

Referring to decision 508 of FIG. 4(f), if the message from the node to the host is an under-bar message, then the host determines if the under-bar message originated from the node which generated the specified condition (decision 510). If not, then the host decrements the node count (step 512). If so, then the host resets the CB flag (step 516) and decrements the node count (step 512). After step 512, the host waits for messages from the nodes as described above (decision 410 and step 412).

As illustrated in FIG. 4(d), if the message sent to the host is an over-bar (decision 500), then the host adds one to the node count (step 502). Then, the host determines if the node count equals the total number of nodes that participate in the logic simulation (decision 504). If not, the host waits for additional messages. However, if the node count equals the total number of nodes that participate in the logic simulation, the host sets the GVT equal to the breakpoint time, and requests the MVT of each node (step 506).

In response to the MVT request, each of the nodes sends its MVT to the host (step 544). In response to the notification of MVT from each of the nodes (decision 560 of FIG. 4(e)), the host adds one to the GVT node count (step 562) and determines the minimum of the MVT and the breakpoint time. Then the host determines if the GVT node count equals the total number of nodes that participate in the logic simulation (decision 566). If not, then the host waits for additional MVT notifications, but if so, then the host broadcasts the new GVT to all the nodes (step 570). The new GVT is the minimum of all the MVTs and the breakpoint time. Then, the host determines if the new GVT equals the breakpoint time (decision 572). If not, the host waits for additional node messages (step 412, decision 410). However, if the new GVT equals the breakpoint, then the host resets the UD flag (step 574). In response to receipt of the new GVT, each of the nodes reads and stores the new GVT, and if the new GVT equals the breakpoint time resets the CB, TB, and FB flags (step 464, decision 465 and step 467 of FIG. 4(e)).

Figure 5:
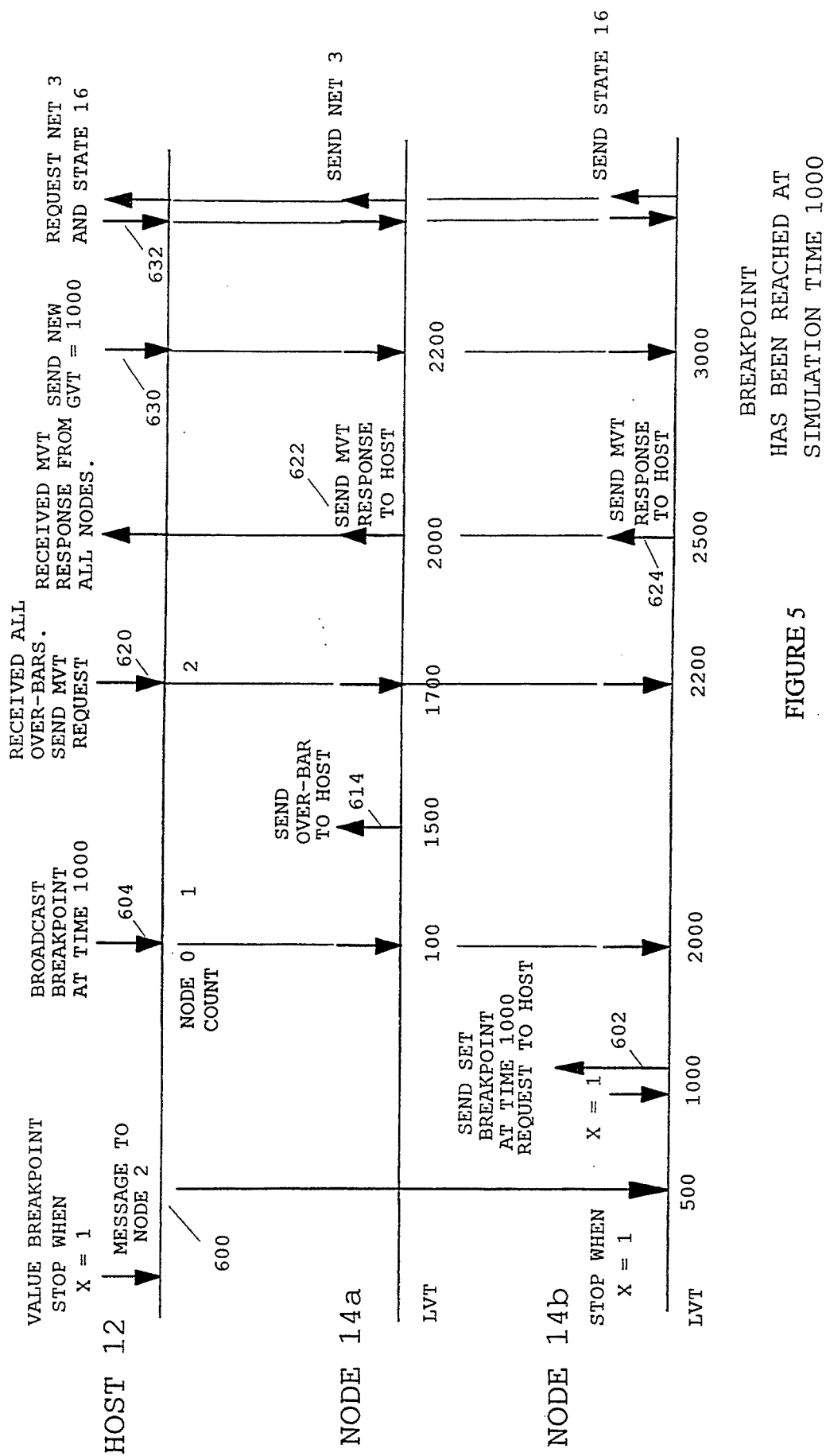
FIG. 5 is a timing chart illustrating one example of condition breakpoint operation of the host computer and nodes of FIG. 1 according to the present invention.

FIG. 5 illustrates a specific example of condition breakpointing according to the present invention. In step 600, a host user specifies a condition breakpoint X=1, the host determines that node 14b is responsible for generating this condition, and notifies node 14b of the condition breakpoint. Subsequently, at 1000 LVT, node 14b generates condition X=1 and notifies the host of the condition and the LVT (step 602). In response, the host broadcasts the breakpoint time of 1000 to both nodes 14a and 14b (step 604). When node 14a reaches 1500 LVT, node 14a sends an over-bar message to the host (step 614). At this time, the host has received the over-bar message from all the nodes and sends an MVT request to both nodes (step 620). Each of the nodes responds with the respective MVT, 2000 for node 14a and 2500 for node 14b (steps 622 and 624). Because both MVTs are greater than the original GVT of 1000, the host transmits a new GVT of 1000 to each of the nodes (step 630). Then, the host requests and displays the net and states requested by the user (step 632).

Figure 6:
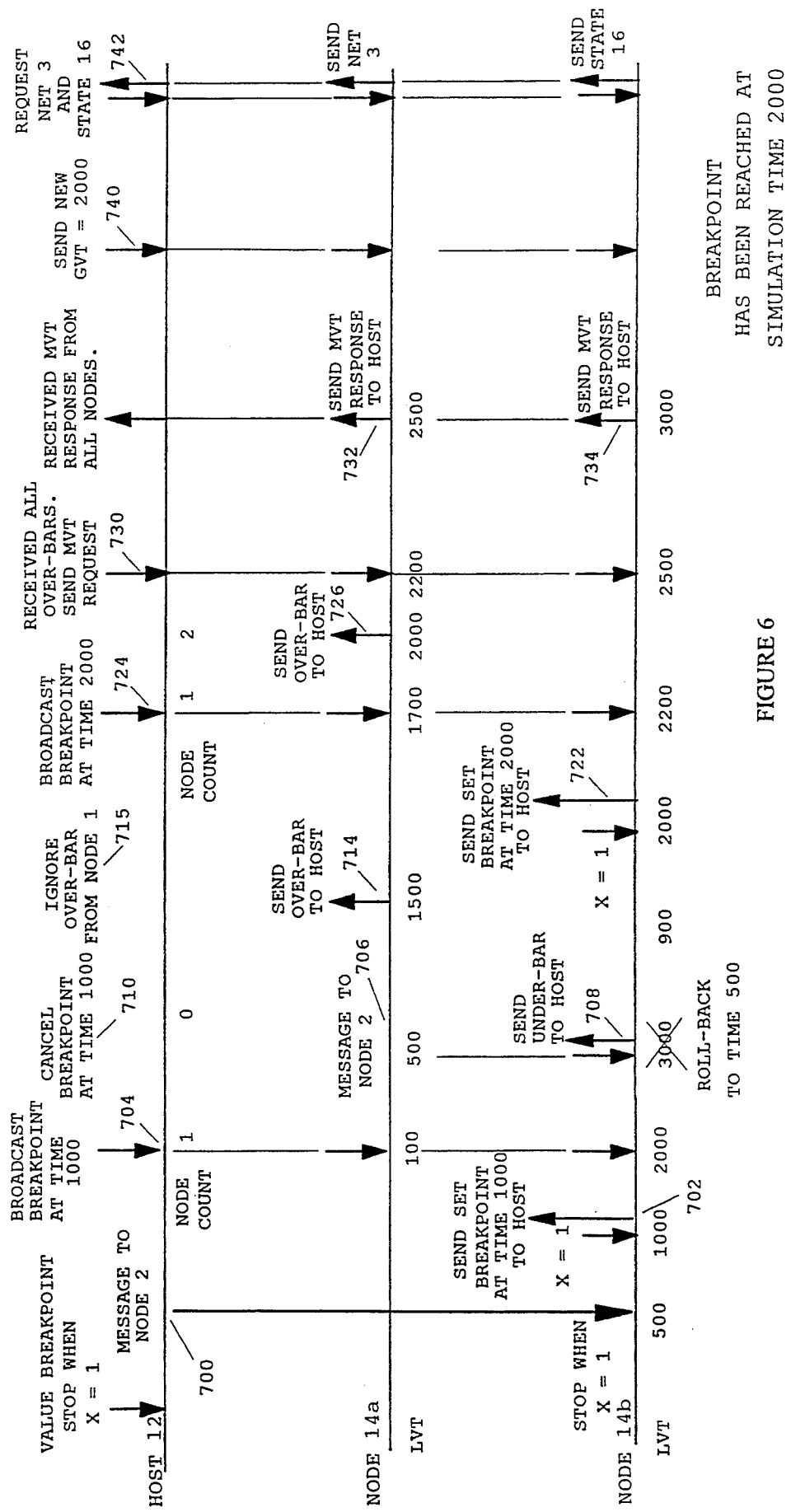
FIG. 6 is a timing chart illustrating another example of condition breakpoint operation of the host computer and nodes of FIG. 1 according to the present invention.

FIG. 6 illustrates another specific example of condition breakpointing according to the present invention. In step 700, a host user specifies a condition breakpoint X=1, the host determines that node 14b is responsible for generating this condition, and notifies node 14b of the condition breakpoint. Subsequently, at 1000 LVT, node 14b generates condition X=1 and notifies the host of the condition and the LVT (step 702). In response, the host broadcasts the breakpoint time of 1000 to both nodes 14a and 14b (step 704). Next,, node 14a sends a net (neighbor) input to node 14b at 500 LVT (step 706). In response, node 14b rolls back from 3000 LVT to 500 LVT and sends an under-bar message to the host (step 708). In response, the host cancels the breakpoint at 1000, but does not notify either of the nodes (step 710). When node 14a reaches 1500 LVT, node 14a sends an over-bar message to the host (step 714). However, because the time breakpoint has been cancelled, the host ignores the over-bar message from node 14a (step 715). Subsequently, node 14b reaches 2000 LVT and generates condition X=1. Consequently, node 14b notifies the host of the condition and the LVT (step 722). In response, the host broadcasts the new breakpoint time of 2000 to both nodes 14a and 14b (step 724). When node 14a reaches 2000 LVT, node 14a sends an over-bar message to the host (step 726). At this time, the host has received the over-bar message from both the nodes and sends an MVT request to both nodes (step 730). Each of the nodes responds with the respective MVT, 2500 for node 14a and 3000 for node 14b (steps 732 and 734). Because both MVTs are greater than the original GVT of 2000, the host transmits a new GVT of 2000 to each of the nodes (step 740). Then, the host requests the nets and states requested by the user (step 742).

Based on the foregoing, a distributed logic simulator according to the present invention has been disclosed. However, numerous modifications and substitutions can be made without deviating from the scope of the present invention. For example, the condition breakpoint can be based on the occurrence of two or more events. In which case, the host notifies each of the nodes that are responsible for generating the two or more events, and these nodes report back when they generate and subsequently cease to generate the specified events. The host determines that both breakpoint conditions have been met only when both nodes exhibit the respective condition at the same time. In such case, the host uses the common time as the breakpoint time, and broadcasts the breakpoint time to all the nodes that participate in the logic simulation. Then, the nodes report back the over-bar and/or under-bar messages as described above, and logic simulation continues until all nodes advance to or past the breakpoint. Also, the foregoing techniques of the present invention can be used to breakpoint at conditions which are specific steps in a high level program such as VHDL. Therefore, the present invention has been disclosed by way of example and not limitation, and reference should be made to the following claims to determine the scope of the present invention.

We claim:

1. A distributed logic simulator for simulating a circuit, said simulator comprising:

a plurality of processors or computing nodes;

a plurality of logic simulation program means, executing on respective ones of said processors or computing nodes, for simulating respective parts of the circuit, each of said logic simulation program means executing at its own pace, including means for receiving an input from or supplying an output to another of said processors or computing nodes, and including means for predicting an input when unavailable from another of said processors or computing nodes;

host means for broadcasting a breakpoint time to said processors or computing nodes; and a plurality of logic simulation control means, executing on respective ones of said processors or computing nodes, for directing storage of nets and/or states of the simulated logic, receiving the breakpoint time and reporting to said host means when the respective logic simulation program means has advanced to or past said breakpoint time; and wherein said host means determines when all of said processors or computing nodes have reported that the respective logic simulation program means has advanced to or past said breakpoint time.

2. A logic simulator as set forth in claim 1 wherein:

said host means further comprises means for requesting from one or more of said processors or computing nodes values of one or more nets and/or states at said breakpoint time, after all of said processors or computing nodes have reported that all the logic simulation program means have advanced to or past said breakpoint time; and said processors or computing nodes includes means, responsive to said requests, for supplying to said host means the requested values.

3. A logic simulator as set forth in claim 2 wherein said host means further comprises means for displaying said values of said one or more nets and/or states supplied by said one or more processors or computing nodes.

4. A logic simulator as set forth in claim 1 wherein said host means further comprises means for sending to one of said processors or computing nodes responsible for generating a condition or event a request to notify said host means when said condition or event occurs and a local virtual time that said condition or event occurred, said local virtual time defining said breakpoint time for subsequent broadcast to the other processors or computing nodes.

5. A logic simulator as set forth in claim 4 wherein said host means also broadcasts said breakpoint time to the processor or computing node responsible for generating said condition or event.

6. A logic simulator as set forth in claim 1 wherein:

each of said logic simulation control means includes means for rolling back the respective logic simulation program means when said logic simulation program means receives an input from another processor or node corresponding to a local virtual time, said logic simulation program means had previously advanced past said local virtual time and used an incorrect prediction for said input.

7. A logic simulator as set forth in claim 6 wherein said logic simulation control program means includes means for notifying said host means when the respective logic simulation program is rolled back to a local virtual time before said breakpoint time and said logic simulation control program means previously reported that the respective logic simulation program means had advanced to or beyond said breakpoint time.

8. A method for simulating a circuit on a plurality of processors or computing nodes, said method comprising the steps of:

simulating parts of the circuit on respective ones of said processors or computing nodes, each of the simulations advancing at its own pace, each of said processors or computing nodes receiving an input from or supplying an output to another of said processors or computing nodes and predicting an input when unavailable from another of said processors or computing nodes;

broadcasting a breakpoint time from a host to said processors or computing nodes;

reporting from each of said processors or nodes to said host when the respective simulation has advanced to or past said breakpoint time; and determining by said host when all of said processors or computing nodes have reported that the respective simulation has advanced to or past said breakpoint time.

9. A method as set forth in claim 8 further comprising the steps of:

requesting by said host from one or more of said processors or computing nodes values of one or more nets and/or states at said breakpoint time, after all of said processors or computing nodes have reported advancement to or past said breakpoint time; and supplying by said processors or computing nodes to said host the requested values.

10. A method as set forth in claim 9 further comprising the step of displaying by said host said values of said one or more nets and/or states supplied by said one or more processors or computing nodes.

11. A method as set forth in claim 8 further comprising the step of sending by said host to one of said processors or computing nodes responsible for generating a condition or event a request to notify said host when said condition or event occurs and a local virtual time that said condition or event occurred, said local virtual time defining said breakpoint time for subsequent broadcast by said host to the other processors or computing nodes.

12. A method as set forth in claim 11 further comprising the step of broadcasting by said host said breakpoint time to the processor or computing node responsible for generating said condition or event.

13. A method as set forth in claim 8 further comprising the step of rolling back the simulation at one of said processors or computing nodes when said processor or computing node receives an input from another processor or computing node corresponding to a local virtual time, and said simulation at said one processor or computing node had previously advanced past said local virtual time and used an incorrect prediction for said input.

14. A method as set forth in claim 13 further comprising the step of notifying said host by said one processor or computing node when the respective simulation is rolled back to a local virtual time before said breakpoint time and said one processor or computing node previously reported that the respective simulation had advanced to or beyond said breakpoint time.

15. A distributed logic simulator for simulating a circuit, said simulator comprising:

a plurality of processors or computing nodes;

a plurality of logic simulation program means, executing on respective ones of said processors or computing nodes, for simulating respective, parts of the circuit;

host means for broadcasting a breakpoint time to said processors or computing nodes; and a plurality of logic simulation control means, executing on respective ones of said processors or computing nodes, for directing storage of nets and/or states of the simulated logic, receiving the breakpoint time and reporting to said host means when the respective logic simulation program means has advanced to or past said breakpoint time; and wherein said host means determines when all of said processors or computing nodes have reported that the respective logic simulation program means has advanced to or past said breakpoint time.

16. A logic simulator as set forth in claim 15 wherein each of said logic simulation program means executes at its own pace.

17. A logic simulator as set forth in claim 15 wherein each of said logic simulation program means receives an input from or supplies an output to another of said processors or computing nodes, and predicts an input when unavailable from another of said processors or computing nodes.

18. A method for simulating a circuit, said method comprising the steps of:

simulating parts of the circuit on respective processors or computing nodes;

broadcasting a breakpoint time from a host to said processors or computing nodes;

reporting from each of said processors or nodes to said host when the respective simulation has advanced to or past said breakpoint time; and determining by said host when all of said processors or computing nodes have reported that the respective simulation has advanced to or past said breakpoint time.

19. A method as set forth in claim 18 wherein each of the simulations advances at its own pace.

20. A method as set forth in claim 18 wherein each of said processors or computing nodes receives an input from or supplies an output to another of said processors or computing nodes and predicts an input when unavailable from another of said processors or computing nodes.

* * * * *